(12) United States Patent
Sawa

(10) Patent No.: US 9,570,667 B2
(45) Date of Patent: Feb. 14, 2017

(54) THERMOELECTRIC CONVERSION MATERIAL, THERMOELECTRIC CONVERSION MODULE USING THE SAME, AND MANUFACTURING METHOD OF THE SAME

(71) Applicants: Kabushiki Kaisha Toshiba, Tokyo (JP); Toshiba Materials Co., Ltd., Yokohama-Shi (JP)

(72) Inventor: Takao Sawa, Yokohama (JP)

(73) Assignees: Kabushiki Kaisha Toshiba, Tokyo (JP); Toshiba Materials Co., Ltd., Yokohama-Shi (JP)

( * ) Notice: Subject to any disclaimer, the term of this patent is extended or adjusted under 35 U.S.C. 154(b) by 85 days.

(21) Appl. No.: 14/597,609

(22) Filed: Jan. 15, 2015

(65) Prior Publication Data

US 2015/0122302 A1 May 7, 2015

Related U.S. Application Data

(63) Continuation of application No. PCT/JP2013/069963, filed on Jul. 17, 2013.

(30) Foreign Application Priority Data

Jul. 17, 2012 (JP) ................................. 2012-158907

(51) Int. Cl.
| | | |
|---|---|---|
| *H01J 35/00* | (2006.01) | |
| *H01L 35/20* | (2006.01) | |
| *C22C 1/04* | (2006.01) | |
| *C22C 19/07* | (2006.01) | |
| *C22C 30/04* | (2006.01) | |
| *C22C 19/03* | (2006.01) | |
| *B22F 3/12* | (2006.01) | |
| *B22F 3/24* | (2006.01) | |
| *B22F 9/04* | (2006.01) | |
| *B22F 9/08* | (2006.01) | |
| *H01L 35/18* | (2006.01) | |

(52) U.S. Cl.
CPC ............... *H01L 35/20* (2013.01); *B22F 3/12* (2013.01); *B22F 3/24* (2013.01); *B22F 9/04* (2013.01); *B22F 9/082* (2013.01); *C22C 1/04* (2013.01); *C22C 1/045* (2013.01); *C22C 1/0433* (2013.01); *C22C 19/03* (2013.01); *C22C 19/07* (2013.01); *C22C 30/04* (2013.01); *H01L 35/18* (2013.01); *B22F 2003/248* (2013.01)

(58) Field of Classification Search
CPC ................................. H01L 35/18; H01L 35/20
See application file for complete search history.

(56) References Cited

U.S. PATENT DOCUMENTS

| | | |
|---|---|---|
| 6,461,581 B1 | 10/2002 | Eguchi et al. |
| 6,797,199 B2 | 9/2004 | Eguchi et al. |
| 2005/0139251 A1 | 6/2005 | Shutoh et al. |
| 2005/0172994 A1 | 8/2005 | Shutoh et al. |
| 2007/0034245 A1 | 2/2007 | Nakajima |
| 2007/0125416 A1 | 6/2007 | Iwanade et al. |
| 2008/0087314 A1 | 4/2008 | Xiao et al. |
| 2010/0147352 A1* | 6/2010 | Matsubara ............... B22F 9/08 136/239 |
| 2010/0193001 A1 | 8/2010 | Hirono et al. |
| 2011/0048590 A1 | 3/2011 | Nakajima |

FOREIGN PATENT DOCUMENTS

| | | |
|---|---|---|
| CN | 1624947 A | 6/2005 |
| CN | 101047223 A | 10/2007 |
| CN | 101080506 A | 11/2007 |
| JP | 2001-044519 A1 | 2/2001 |
| JP | 2006-165125 A1 | 6/2006 |
| JP | 2006-203186 A1 | 8/2006 |
| JP | 2007-173799 A1 | 7/2007 |
| JP | 2008-147625 A1 | 6/2008 |
| JP | 2008-311247 A1 | 12/2008 |
| JP | 2009-084689 A1 | 4/2009 |
| JP | 2009-277735 A1 | 11/2009 |
| JP | 2010-129636 A1 | 6/2010 |
| WO | 2009/001598 A1 | 12/2008 |
| WO | 2009/008127 A1 | 1/2009 |
| WO | 2012/087931 A2 | 6/2012 |

OTHER PUBLICATIONS

Japanese Office Action (Application No. 2014-525902) dated May 26, 2015 (with English translation).

(Continued)

*Primary Examiner* — Carol M Koslow
(74) *Attorney, Agent, or Firm* — Burr & Brown, PLLC

(57) ABSTRACT

According to an embodiment, a thermoelectric conversion material is made of a polycrystalline material which is represented by a composition formula (1) shown below and has a MgAgAs type crystal structure. The polycrystalline material includes a MgAgAs type crystal grain having regions of different Ti concentrations.

$(A_a Ti_b)_c D_d X_e$    Composition formula (1)

wherein $0.2 \leq a \leq 0.7$, $0.3 \leq b \leq 0.8$, $a+b=1$, $0.93 \leq c \leq 1.08$, and $0.93 \leq e \leq 1.08$ hold when $d=1$; A is at least one element selected from the group consisting of Zr and Hf, D is at least one element selected from the group consisting of Ni, Co, and Fe, and X is at least one element selected from the group consisting of Sn and Sb.

18 Claims, 5 Drawing Sheets

(2 of 5 Drawing Sheet(s) Filed in Color)

(56) References Cited

OTHER PUBLICATIONS

International Search Report and Written Opinion (Application No. PCT/JP2013/069963) dated Oct. 15, 2013.
Japanese Office Action (Application No. 2014-525902) dated Mar. 15, 2016 (with English translation).
English translation of International Preliminary Report on Patentability (Application No. PCT/JP2013/069963) dated Jan. 29, 2015.
Chinese Office Action (Application No. 201380028168.7) dated May 4, 2016 (with English translation).

* cited by examiner

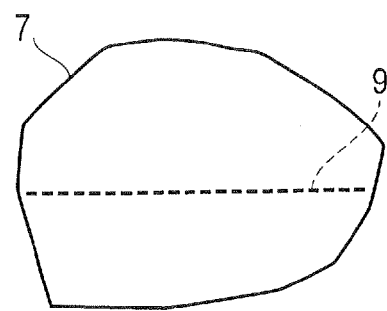
F I G. 3
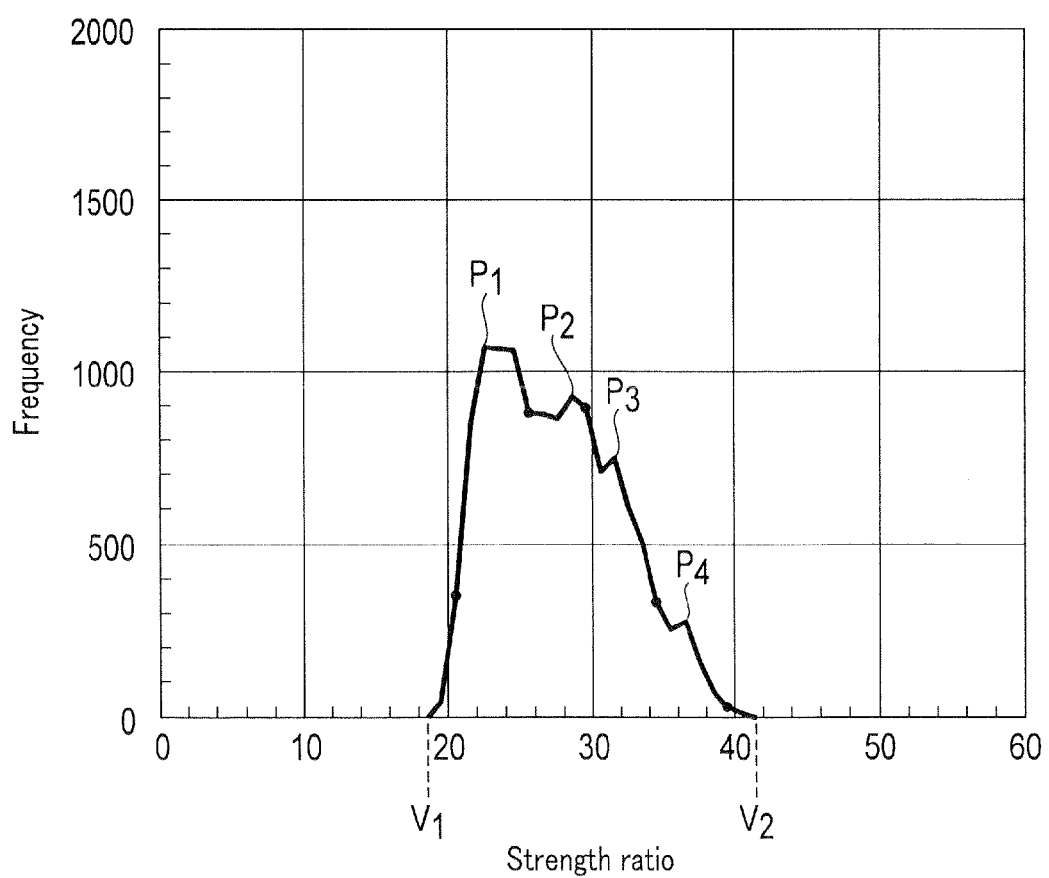
F I G. 4

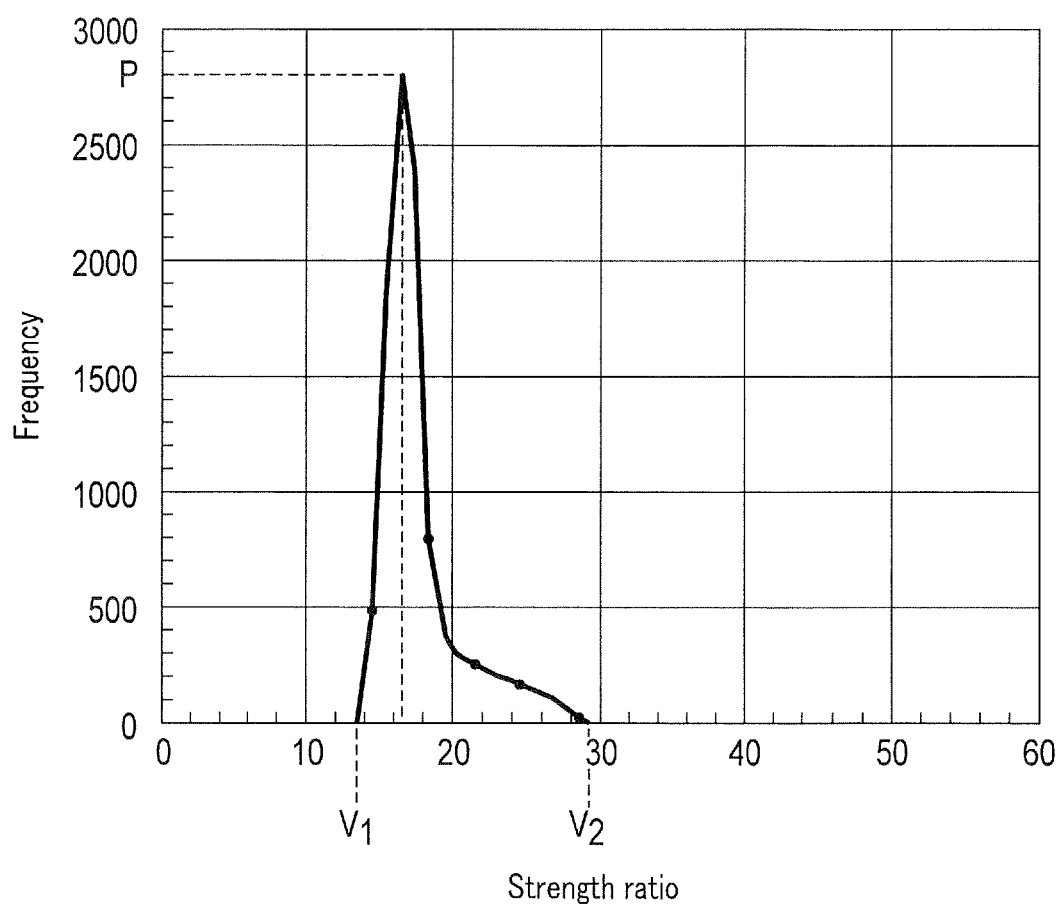
F I G. 7

THERMOELECTRIC CONVERSION MATERIAL, THERMOELECTRIC CONVERSION MODULE USING THE SAME, AND MANUFACTURING METHOD OF THE SAME

CROSS-REFERENCE TO RELATED APPLICATIONS

This application is a Continuation Application of PCT Application No. PCT/JP2013/069963, filed Jul. 17, 2013 and based upon and claiming the benefit of priority from Japanese Patent Application No. 2012-158907, filed Jul. 17, 2012, entire contents of all of which are incorporated herein by reference.

FIELD

Embodiments described herein relate generally to a thermoelectric conversion material, a thermoelectric conversion module using the thermoelectric conversion material, and a manufacturing method of the thermoelectric conversion material.

BACKGROUND

In recent years, with growing awareness of global environmental issues, there has been an increasing interest in a thermoelectric cooling element using the Peltier effect as a CFC-free cooling device. Also, there has been an increasing interest a thermoelectric generation device providing a power generation system using unused waste heat energy and using the Seebeck effect to reduce the amount of emission of carbon dioxide.

A performance index Z of a thermoelectric conversion material is represented by the following formula (1): $Z = \alpha^2/(\rho\kappa)$ ... (1), where $\alpha$ is the Seebeck coefficient of the thermoelectric conversion material, $\rho$ is the electric resistivity of the thermoelectric conversion material, and $\kappa$ is the thermal conductivity of the thermoelectric conversion material. Z has the dimension of an inverse of the temperature and becomes a dimensionless value when multiplied by the absolute temperature T. The ZT value is called a dimensionless performance index and thermoelectric conversion efficiency increases with a thermoelectric conversion material having an increasing ZT value. As is evident from the above formula (1), a higher Seebeck coefficient, a lower electrical resistivity, and a lower thermal conductivity are demanded of the thermoelectric conversion material.

A PbTe alloy has been used in a conventional thermoelectric conversion material, but Pb (lead) is harmful to humans. On the other hand, a half-Heusler compound having a MgAgAs type crystal phase attracts attention as a thermoelectric conversion material that can be used even at a high temperature and does not contain harmful substances at all or reduces such substances to a minimum. According to Jpn. Pat. Appln. KOKAI Publication No. 2007-173799 (Patent Literature 1), a certain improvement in the ZT value in the half-Heusler compound is achieved by the inclusion of a predetermined composition, but a still higher ZT value is demanded.

In Jpn. Pat. Appln. KOKAI Publication No. 2010-129636 (Patent Literature 2), a half-Heusler alloy whose ZT value is improved by including crystals of different Ti molar concentrations.

CITATION LIST

Patent Literature

Patent Literature 1: Jpn. Pat. Appln. KOKAI Publication No. 2007-173799
Patent Literature 2: Jpn. Pat. Appln. KOKAI Publication No. 2010-129636

BRIEF DESCRIPTION OF DRAWINGS

The patent or application file contains at least one drawing executed in color. Copies of this patent or patent application publication with color drawing(s) will be provided by the Office upon request and payment of the necessary fee.

FIG. 3 is a diagram showing an example of a measuring method of characteristic X-rays of Ti.

FIG. 4 is an example of a strength ratio-frequency graph in Example 7.

FIG. 7 is a strength ratio-frequency graph in Example 11.

DETAILED DESCRIPTION

Figure 1:
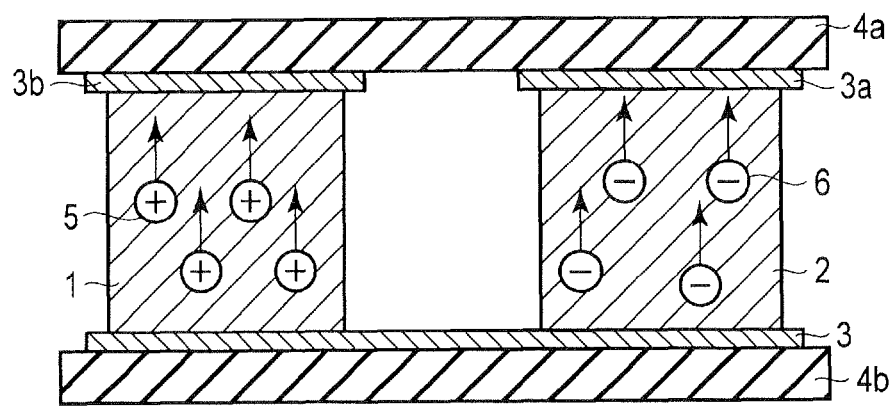
FIG. 1 is a diagram showing an example of a thermoelectric conversion module according to an embodiment.

A thermoelectric conversion material including MgAgAs type crystals of two phases or more having different Ti molar concentrations as described in Patent Literature 2 achieves a certain improvement in the ZT value. On the other hand, the thermoelectric conversion material is made of a polycrystalline material, thus it is difficult to maintain MgAgAs type crystal grains of two phases or more having different Ti molar concentrations in a uniform state. If the abundance ratio of MgAgAs type crystal grains of two phases or more having different Ti molar concentrations varies, characteristics of individual thermoelectric conversion materials vary. Thus, a problem of variations in characteristics as a module is posed when a thermoelectric conversion module is formed by arranging a plurality of thermoelectric conversion materials.

Embodiments are intended to handle the above problem and an object thereof is to provide a thermoelectric conversion material that improves the ZT value and then reduces variations in characteristics, a thermoelectric conversion module using the thermoelectric conversion material, and a manufacturing method of the thermoelectric conversion material.

A thermoelectric conversion material according to an embodiment is a thermoelectric conversion material made of a polycrystalline material represented by a composition formula (1) shown below and having a MgAgAs type crystal structure. The polycrystalline material includes MgAgAs type crystal grains having regions of different Ti concentrations.

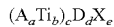   Composition formula (1)

(in the composition formula (1) shown above, $0.2 \le a \le 0.7$, $0.3 \le b \le 0.8$, $a+b=1$, $0.93 \le c \le 1.08$, and $0.93 \le e \le 1.08$ hold when $d=1$; A is at least one element selected from the group consisting of Zr and Hf, D is at least one element selected from the group consisting of Ni, Co, and Fe, and X is at least one element selected from the group consisting of Sn and Sb).

The thermoelectric conversion material preferably includes MgAgAs type crystal grains for which two or more peaks are present in a frequency graph in which a strength of characteristic X-rays of Ti is plotted on a horizontal axis and a frequency for each strength of the characteristic X-rays of Ti is plotted on a vertical axis when the characteristic X-rays of Ti are measured at intervals of 0.2 μm in a MgAgAs type crystal grain on any sintered surface of the thermoelectric conversion material by EBSD (backscattering electron beam diffraction).

When characteristic X-rays of Ti are measured at intervals of 0.2 μm in a MgAgAs type crystal grain on any sintered surface of the thermoelectric conversion material by EBSD (backscattering electron beam diffraction) to create the frequency graph in which the strength ratio of the characteristic X-rays of Ti is plotted on the horizontal axis and the frequency for each strength of the characteristic X-rays of Ti is plotted on the vertical axis, the thermoelectric conversion material preferably includes MgAgAs type crystal grains for which two or more peaks are present in the frequency graph and a ratio (K1/K2) of a frequency K1 of a highest peak to a frequency K2 of a lowest peak is preferably 1.2 or greater.

When characteristic X-rays of Ti are measured at intervals of 0.2 μm in a MgAgAs type crystal grain in a unit area of 240 μm×80 μm on any sintered surface of the thermoelectric conversion material by EBSD (backscattering electron beam diffraction) to create the frequency graph in which the strength of the characteristic X-rays of Ti is plotted on the horizontal axis and the frequency for each strength of the characteristic X-rays of Ti is plotted on the vertical axis, the thermoelectric conversion material preferably includes MgAgAs type crystal grains for which two or more peaks are present in the frequency graph, and the MgAgAs type crystal grains preferably have a number ratio of crystal grains of 30% or more and 100% or less.

When a measuring area of 240 μm×80 μm on any sintered surface of the thermoelectric conversion material is analyzed by EBSD (backscattering electron beam diffraction) and a total number of crystal grains per unit area is set to 1, the number ratio of the crystal grains indicating any crystal orientation of a (001) plane, a (101) plane, and a (111) plane is preferably less than 0.5.

An average crystal grain size is preferably 2 to 40 μm. Also, the polycrystalline material is preferably a sintered body. Also, MgAgAs type crystal grains preferably have an area ratio of 92% or more in an area of 240 μm×80 μm.

A thermoelectric conversion module according to an embodiment is characterized in that the thermoelectric conversion module includes the thermoelectric conversion materials according to an embodiment.

A first manufacturing method of a thermoelectric conversion material according to an embodiment includes a step of preparing the raw material molten metal satisfying the composition formula (1), a step of preparing the raw material powder by cooling the raw material molten metal at the cooling rate of 100° C./s or slower, a step of molding the obtained raw material powder, and a step of sintering the obtained molded body. The step of preparing the raw material powder preferably includes steps of producing an ingot by the step of cooling and pulverizing the ingot.

A second manufacturing method of a thermoelectric conversion material according to an embodiment includes a step of preparing the raw material molten metal satisfying the composition formula (1), a step of preparing the raw material powder by rapidly cooling the raw material molten metal at the cooling rate exceeding 100° C./s, a step of heat-treating the obtained raw material powder, a step of molding the heat-treated raw material powder, and a step of sintering the obtained molded body.

A third manufacturing method of a thermoelectric conversion material according to an embodiment includes a step of preparing the raw material molten metal satisfying the composition formula (1), a step of preparing the raw material powder by rapidly cooling the raw material molten metal at the cooling rate exceeding 100° C./s, a step of molding the obtained raw material powder, a step of sintering the obtained molded body, and a step of heat-treating the obtained sintered body.

The step of preparing the raw material powder by rapidly cooling the raw material molten metal at the cooling rate exceeding 100° C./s is preferably an atomizing method.

A thermoelectric conversion material according to the embodiments has a large ZT value and reduced variations in characteristics. Thus, characteristics of a thermoelectric conversion module are also improved. In addition, a thermoelectric conversion material according to an embodiment can be manufactured with high yields by any manufacturing method of a thermoelectric conversion material according to an embodiment.

A thermoelectric conversion material according to an embodiment is a thermoelectric conversion material made of a polycrystalline material represented by a composition formula (1) shown below and having a MgAgAs type crystal structure, wherein MgAgAs type crystal grains having regions of different Ti concentrations are included in the polycrystalline material having the MgAgAs type crystal structure.

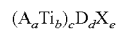  Composition formula (1)

(In the composition formula (1) shown above, $0.2 \leq a \leq 0.7$, $0.3 \leq b \leq 0.8$, $a+b=1$, $0.93 \leq c \leq 1.08$, and $0.93 \leq e \leq 1.08$ hold when $d=1$. A is at least one element selected from the group consisting of Zr and Hf, D is at least one element selected from the group consisting of Ni, Co, and Fe, and X is at least one element selected from the group consisting of Sn and Sb.)

In the composition formula (1), the A element is at least one element selected from Zr (zirconium) and Hf (hafnium). The A element, Ti and the X element are elements needed to make a phase having the MgAgAs type crystal structure the main phase. Ti and the X element are described later. It is preferable to contain both of Zr and Hf to improve thermoelectric conversion characteristics. When both of Zr and Hf are contained, it is preferable to set the atomic ratio of Zr and Hf (Zr/Hf) to the range of from 0.3 to 0.7. To reduce the cost, it is preferable to set the Hf/Zr atomic ratio to 0.1 or less (the Zr/Hf atomic ratio is 0.9 or more).

Because Ti (titanium) is inexpensive in price when compared with Zr and Hf, the cost of the thermoelectric conversion material can be reduced by replacing a portion of the A element with Ti. In addition, the effect of reducing thermal conductivity can be achieved by containing Ti.

The X element is at least one of Sn (tin) and Sb (antimony). It is preferable to contain both of Sn and Sb to improve thermoelectric conversion characteristics.

The D element is at least one element selected from Ni (nickel), Co (cobalt), and Fe (iron). The D element is an element that is effective in stabilizing the phase of the MgAgAs type crystal structure. Among these elements, Ni or Co is preferable and further, corrosion resistance is improved.

The atomic ratios of each element are $0.2 \leq a \leq 0.7$, $0.3 \leq b \leq 0.8$, $a+b=1$, $0.92 \leq c \leq 1.08$, and $0.92 \leq e \leq 1.08$ when $d=1$. If the atomic ratio deviates from the above range, the phase of the MgAgAs type crystal structure cannot be stabilized and sufficient thermoelectric characteristics cannot be obtained. The composition formula (1) shows the average values when the composition of 0.1 g or more of a sample piece of the thermoelectric conversion material is examined.

It is preferable to adopt the composition rich in Ni as the D element and also rich in Sn as the X element when an N-type thermoelectric conversion material is to be produced and it is also preferable to adopt the composition rich in Co as the D element and also rich in Sb as the X element when a P-type thermoelectric conversion material is to be produced.

A thermoelectric conversion material according to an embodiment only needs to include MgAgAs type crystal grains in 92% or more as the area ratio. That is, other phases may be present in 8% or less. Other phases occupy 8% or less of the 4a group and Sn-containing phase (for example, $Ti_5Sn_3$), 2% or less of the Sn phase, and 1% or less of the 4a group oxide. In addition, 1.5% or less of a reaction product phase containing components mixed from a crucible during a melting process of raw materials may be contained. Reaction product phases mixed from a crucible include reactants with the D element such as an AlNi phase and an AlCo phase when an Al crucible (made of alumina) is used.

Metallic impurities other than those represented by the composition formula (1) shown above are preferably 3000 wtppm or less and further preferably, 2500 wtppm or less. When at least one element selected from a group of Ni and Co is used as the D element, iron (Fe) or chromium (Cr) can mainly be cited as metallic impurities. In addition, a portion or all of metallic impurities may be contained in a MgAgAs type crystal lattice.

A thermoelectric conversion material according to an embodiment is a thermoelectric conversion material made of a polycrystalline material represented by the composition formula (1) and having the MgAgAs type crystal structure, wherein crystal grains having regions of different Ti concentrations are included in MgAgAs type crystal grains. This means that at least one MgAgAs type crystal grain in the crystal grains includes a region of a different Ti concentration. In the embodiment, the ZT value can be improved and variations in characteristics can be reduced by including regions of different Ti concentrations in crystal grains.

Whether a region of a different Ti concentration is present in crystal grains can be checked by EBSD analysis. EBSD is an abbreviation of electron backscatter diffraction. EBSD is a method of measuring the crystal orientation by irradiating a sample obliquely set inside a SEM sample chamber with an electron beam, capturing an image of a backscattering electron beam diffraction pattern projected onto a fluorescent screen by a CCD camera, and indexing crystal information. The crystal information includes a space group, a lattice constant, and atomic coordinates (crystal orientation). If a color mapping function is used when crystal information imaging is performed, the presence of regions with different colors in a crystal grain can be analyzed. The presence of regions with different colors in a crystal grain means that a phase structure of a different composition is present. The thermoelectric conversion material according to the embodiment has a b value indicating the amount of Ti in the composition formula (1) in the range of $0.3 \leq b \leq 0.8$, thus the phase structure of a different composition can be said to be a phase structure of two phases or more having different Ti concentrations. Regions of different peak strength ratios of characteristic X-rays of Ti are present in a crystal grain when characteristic X-rays of Ti are examined, thus analysis can also be carried out based on this.

Figure 2:
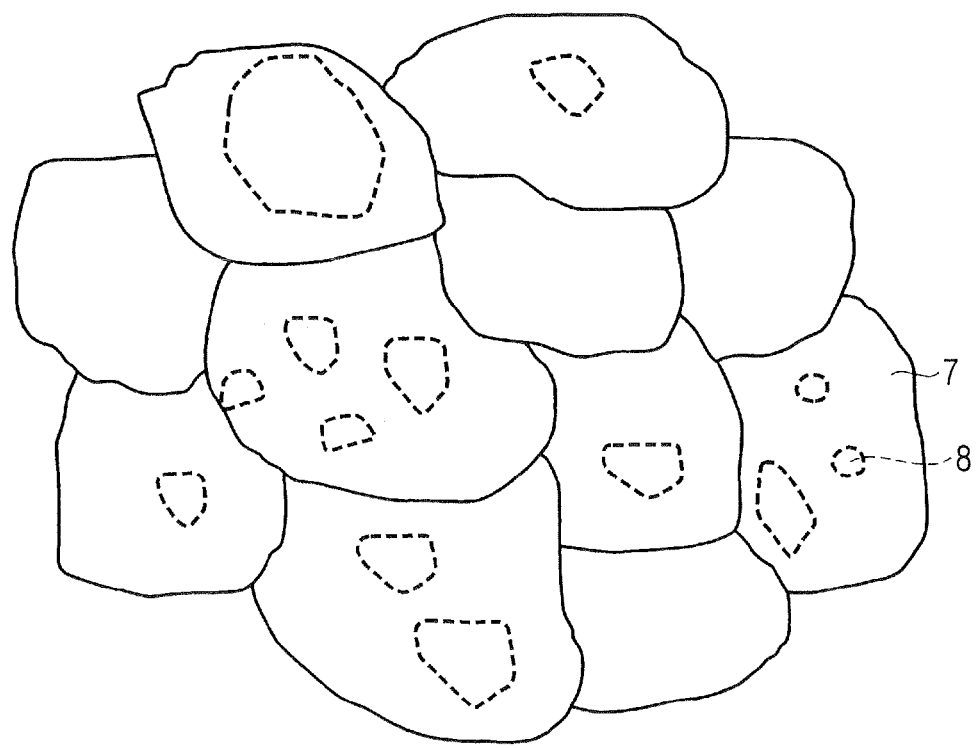
FIG. 2 is a diagram showing an example of a crystalline structure of a thermoelectric conversion material according to an embodiment.

The analysis by EBSD is carried out after any sintered surface of the thermoelectric conversion material is polished to a flat surface with a surface roughness of Ra 5 μm or less. Also in the analysis of EBSD, observations are made at an acceleration voltage of 20 kV under a magnification of 1000 times or more. If a region where the peak strength ratio of characteristic X-rays of Ti is 15 or more and a region where the peak strength ratio is less than 15 are color-mapped when any sintered surface of the thermoelectric conversion material is analyzed by EBSD (backscattering electron beam diffraction), the presence of regions having different Ti concentrations in a MgAgAs type crystal grain becomes apparent. FIG. 2 shows an example of a crystalline structure of a thermoelectric conversion material according to an embodiment. In FIG. 2, reference numeral 7 indicates MgAgAs type crystal grains and reference numeral 8 indicates a region of a different Ti concentration. If, for example, a region where the peak strength ratio of characteristic X-rays of Ti is 15 or more and a region where the peak strength ratio is less than 15 are color-mapped, a region of a high Ti concentration (region where the peak strength ratio of characteristic X-rays is 15 or more) and a region of a low Ti concentration (region where the peak strength ratio of characteristic X-rays is less than 15) can be distinguished. Also, as a result of color mapping, the region 8 of a different Ti concentration may be included in two locations or more.

When characteristic X-rays of Ti are measured at intervals of 0.2 μm in a MgAgAs type crystal grain on any cross section of the thermoelectric conversion material by EBSD (backscattering electron beam diffraction) to create a frequency graph in which the strength ratio of characteristic X-rays of Ti is plotted on the horizontal axis and the frequency for each strength ratio of characteristic X-rays of Ti is plotted on the vertical axis, it is preferable to include MgAgAs type crystal grains for which two or more peaks are present in the frequency graph.

FIG. 3 shows an example of a measuring method of characteristic X-rays of Ti. In FIG. 3, reference numeral 7 indicates MgAgAs type crystal grains and reference numeral 9 indicates measurement locations for measuring characteristic X-rays of Ti. In a MgAgAs type crystal, characteristic X-rays of Ti are measured at intervals of 0.2 μm. The strength ratio of each measured characteristic X-rays of Ti is determined. A frequency graph is created by plotting the appearance frequency for each strength ratio. By making measurements of a MgAgAs type crystal grain linearly at intervals of 0.2 μm by changing the measurement location, the presence of regions of different Ti concentrations in crystal grains becomes apparent.

When a frequency graph is created, the frequency graph preferably has two or more peaks present therein. FIG. 4 shows an example of the strength ratio-frequency graph of Example 7. FIG. 4 shows the strength ratio on the horizontal axis and the frequency of the strength ratio on the vertical axis. In Example 7 described later, there are four peaks, at strength ratio 22.5, strength ratio 28, strength ratio 32, and strength ratio 37. FIG. 4 shows these peaks by setting the peak at strength ratio 22.5 as P1, the peak at strength ratio 28 as P2, the peak at strength ratio 32 as P3, and the peak at strength ratio 37 as P4.

When characteristic X-rays of Ti are measured at intervals of 0.2 μm in a MgAgAs type crystal grain on any sintered surface of the thermoelectric conversion material by EBSD (backscattering electron beam diffraction) to create a frequency graph in which the strength ratio of characteristic X-rays of Ti is plotted on the horizontal axis and the frequency for each strength ratio of characteristic X-rays of Ti is plotted on the vertical axis, it is preferable to include MgAgAs type crystal grains for which two or more peaks are present in the frequency graph and also the ratio (K1/K2) of a frequency K1 of the highest peak to a frequency K2 of the lowest peak is preferably 1.2 or greater. In FIG. 4, for example, the strength ratio of the highest peak P1 is 22.5 and the frequency K1=1070 and the strength ratio of the lowest peak is 37 and the frequency K2=283 and therefore, K1/K2=1070/283=3.78 is obtained.

That the (K1/K2) ratio is 1.2 or more means that the difference of Ti concentrations in a crystal grain is large. That there are two or more peaks and the peak ratio thereof is 1.2 or more means that a Ti rich region and a Ti poor region are present in a crystal grain. Also, by the peaks, the Ti rich regions have the same amount of Ti each other and the Ti poor regions also have the same amount of Ti each other. By creating such a Ti distribution, variations of Ti rich regions can be reduced and also variations in composition of Ti poor regions can be reduced while including regions of different Ti concentrations in a crystal grain and therefore, an effect of stabilizing characteristics can be achieved.

That K1/K2 is 1.2 or more indicates that there are many regions of high Ti concentrations in a MgAgAs type crystal. If there are many regions of high Ti concentrations, thermal conductivity can preferably be made to fall to 3.0 W/m·K or below and further to 2.0 W/m·K or below.

Also, in a frequency graph in which there are two or more peaks, the difference between the maximum value and the minimum value is preferably 10 or more and further 15 or more. That "maximum value−minimum value ≥10" means that the frequency graph is a broad graph in width. That the frequency graph is a broad graph indicates that the difference in Ti concentrations in MgAgAs type crystal grains is large. A larger difference in Ti concentrations in MgAgAs type crystal grains makes it easier to obtain an effect of improvement in characteristics.

When characteristic X-rays of Ti are measured at intervals of 0.2 μm in a MgAgAs type crystal grain in a measuring area of 240 μm×80 μm on any sintered surface of the thermoelectric conversion material by EBSD (backscattering electron beam diffraction) to create a frequency graph in which the strength of characteristic X-rays of Ti is plotted on the horizontal axis and the frequency for each strength of characteristic X-rays of Ti is plotted on the vertical axis, MgAgAs type crystal grains for which two or more peaks are present in the frequency graph preferably have a number ratio of crystal grains of 30% or more and 100% or less.

With the presence of MgAgAs type crystal grains having regions of different Ti concentrations as described above in 30% or more and 100% or less of the unit area, characteristic improvements can be obtained by reducing structural variations per unit area. If the number ratio is less than 30% per unit area and small, the abundance ratio of MgAgAs type crystal grains having regions of different Ti concentrations decreases and there is the possibility of variations in characteristics. In particular, it is preferable for a polycrystalline material to contain MgAgAs type crystal grains having regions of different Ti concentrations in a predetermined ratio as a crystalline structure. Therefore, MgAgAs type crystal grains having regions of different Ti concentrations are preferably present at 30% or more and 100% or less per unit area and further preferably, 50% or more and 100% or less.

The measuring method of the number of MgAgAs type crystal grains having regions of different Ti concentrations per unit area is to count the total number of crystal grains present in the area of 240 μm×80 μm and the number of crystal grains of different Ti concentrations. The number ratio is determined by (number of MgAgAs type crystal grains having regions of different Ti concentrations/total number)×100%. This work is repeated for three locations of the measuring area (240 μm×80 μm) to obtain the number ratio. For measurement of the number ratio, color mapping separating into the Ti concentration regions where the strength ratio of characteristic X-rays is 15 or more and the Ti concentration regions where the strength ratio is less than 15 may be performed. When color mapping is performed, the strength ratio of characteristic X-rays of Ti may be set to any strength ratio, such as 20 or more or less than 20.

As described above, the frequency graph of Ti concentration preferably has two or more peaks. As a method of obtaining similar characteristics, when characteristic X-rays of Ti are measured at intervals of 0.2 μm in a MgAgAs type crystal grain on any cross section of the thermoelectric conversion material by EBSD (backscattering electron beam diffraction) to create a frequency graph in which the strength ratio of characteristic X-rays of Ti is plotted on the horizontal axis and the frequency for each strength ratio of characteristic X-rays of Ti is plotted on the vertical axis, a method in which the frequency graph has one peak and the lower limit of the frequency graph is smaller than the frequency indicating a peak by 5 or more and the upper limit of the frequency graph is larger than the frequency indicating a peak by 5 or more can be cited. In addition, the value obtained by subtracting the lower limit from the upper limit is preferably 15 or more and further preferably, 20 or more.

Even if the frequency graph has only one peak, when the lower limit is smaller than the frequency indicating a peak by 5 or more and the upper limit is larger than the peak frequency by 5 or more, that is, "upper limit−lower limit ≥10", the difference in Ti concentrations in MgAgAs type crystal grains increases and the same effect can be obtained when there are two or more peaks. To increase the difference in Ti concentrations in MgAgAs type crystal grains, the value obtained by subtracting the lower limit from the upper limit of the frequency graph is preferably 15 or more and further preferably, 20 or more.

Both of the above cases of two or more peaks in the frequency graph or only one peak, but "upper limit−lower limit ≥10" increase the difference in Ti concentrations in MgAgAs type crystal grains. When a difference in Ti concentrations is set, the concentration of Zr or Hf as the A element decreases in accordance with the Ti concentration. There is no significant change in concentration of Ni or Co as the D element. The concentration of Sn or Sb as the X element increases in accordance with the Ti concentration. That is, a region rich in Ti becomes a region rich in Sn and a region poor in Ti becomes a region poor in Sn. The reason therefor is that when lattice constants of TiCoSb, TiCoSn, ZrCoSb, and ZrCoSn are compared based on ASTM cards, the former three have a cubic crystal structure (half-Heusler phase) with a=5.884 Å, 6.009 Å, 6.070 Å respectively, and ZrCoSn, on the other hand, has a hexagonal crystal (a=7.142 Å, c=3.583 Å). Thus, in the case of lattice constants in a stable region range of the cubic crystal structure, lattice constants of the TiCoSn phase and the ZrCoSb phase are relatively close and from the viewpoint of reducing distortion in a metallographic structure, these two phases are considered to be rich in Sn in a Ti rich phase and poor in Sn in a Ti poor phase. By setting a difference in Ti concentrations in MgAgAs type crystal grains, a difference in concentration arises for each constituent element shown in the composition formula (1). The occurrence of such a difference in concentration can also lower the thermal conductivity of the MgAgAs type crystal grains.

When the unit area 240 μm×80 μm on any cross section of the thermoelectric conversion material is analyzed by EBSD (backscattering electron beam diffraction), if the total number of crystal grains per unit area is set to 1, the number ratio of crystal grains indicating any crystal orientation of the (001) plane, (101) plane, and (111) plane is preferably less than 0.5. That the number ratio of crystal grains indicating any crystal orientation of the (001) plane, (101) plane, and (111) plane is preferably less than 0.5 when the total number of crystal grains per unit area is set to 1 indicates a randomly oriented crystalline structure, instead of a crystalline structure with a specific crystal orientation. The random orientation can better provide a uniform structure, stabilizing characteristics.

The average crystal grain size is preferably 2 to 40 μm. If the average crystal grain size is less than 2 μm, crystal grains are too small and it is difficult to form a crystal grain having regions of different Ti concentrations. If the average crystal grain size exceeds 40 μm, variations of the crystalline structure may become large. Thus, the average crystal grain size is preferably 2 to 40 μm and further preferably, 5 to 20 μm. As the measuring method of the average grain size, a structure photo provided by EBSD analysis with an area of 240 μm×80 μm is used and the longest diagonal of individual crystal grains is set as the grain size. This work is repeated for 50 grains and the average value thereof is set as the average crystal grain size. If 50 grains of an area of 240 μm×80 μm are not obtained, an additional analysis is carried out until 50 grains are obtained.

The polycrystalline material is preferably a sintered body. As will be described later, if the polycrystalline material is a sintered body, manufacturing with high yields can be achieved.

Next, a thermoelectric conversion module will be described. FIG. 1 shows an example of a thermoelectric conversion module. In FIG. 1, reference numeral 1 is a P-type thermoelectric conversion material, reference numeral 2 is an N-type thermoelectric conversion material, reference numerals 3, 3a, 3b are electrodes, reference numerals 4a, 4b are insulating substrates, reference numeral 5 is a hole, and reference numeral 6 is an electron. The undersurfaces of the P-type thermoelectric conversion material 1 and the N-type thermoelectric conversion material 2 are connected by the electrode 3 supported by the lower insulating substrate 4b. The electrodes 3b, 3a are arranged on the top surfaces of the P-type thermoelectric conversion material 1 and the N-type thermoelectric conversion material 2, respectively, and the upper insulating substrate 4a is provided on the outer side thereof. The P-type thermoelectric conversion material 1 and the N-type thermoelectric conversion material 2 are arranged as a pair and a plurality of P-type thermoelectric conversion materials and a plurality of N-type thermoelectric conversion materials are structured to be alternately arranged.

A thermoelectric conversion material according to an embodiment is to be used for one of the N-type and P-type thermoelectric conversion materials of a thermoelectric module or for both. When a thermoelectric conversion material according to an embodiment is to be used for one of the N-type and P-type thermoelectric conversion materials, a Bi—Te or Pb—Te material may be used for the other. If characteristics of a thermoelectric module and harmfulness of Pb are taken into consideration, it is preferable to use a thermoelectric conversion material according to an embodiment for both of the P-type and N-type thermoelectric conversion materials.

For the insulating substrates (4a, 4b), a ceramic substrate, for example, a silicon nitride substrate whose three-point bending strength is 700 MPa or more is preferable. By using the silicon nitride substrate, the heat resistance of the thermoelectric module can be improved. As the electrodes (3a, 3b, 3), a plate with good conductivity such as a copper plate or an aluminum plate is preferable. It is also preferable to use a high-temperature brazing filler metal to join the electrode and the thermoelectric conversion material. The melting point of the high-temperature brazing filler metal is preferably in the range of 600 to 900° C. In addition, the joint surface may be plated with a metal if necessary.

A thermoelectric conversion material according to an embodiment can still be used even if the higher temperature side is in the high-temperature range of 300 to 500° C. When used, for example, in a high-temperature environment of 500° C., the brazing filler metal will melt if the melting point of the brazing filler metal is less than 600° C., damaging the module.

Next, the principle of a thermoelectric conversion module will be described. A temperature difference is provided such that the lower insulating substrate 4b is on the lower-temperature side and the upper insulating substrate 4a is on the higher-temperature side. In this case, the holes 5 having a positive charge move to the high-temperature side (upper side) inside the P-type thermoelectric conversion material 1. Inside the N-type thermoelectric conversion material 2, on the other hand, the electrons 6 having a negative charge move to the high-temperature side (upper side). As a result, a potential difference arises between the electrode 3b on the P-type thermoelectric conversion material 1 and the electrode 3a on the N-type thermoelectric conversion material 2. Using this phenomenon, heat can be converted into electricity or electricity can be converted into heat.

Also, heat resistance characteristics are improved by using the aforementioned brazing filler metal or silicon nitride substrate so that superior characteristics can be exhibited even in a high-temperature environment close to 500° C. or in a high-load environment in which the difference in temperature between the low-temperature side and the high-temperature side is 100° C. or more.

While a module structure of a p-type and n-type pair is illustrated in FIG. 1, the module size may be made larger by arranging a plurality of p-type and the n-type pairs. Characteristics of the thermoelectric conversion material according to the embodiment have been improved and characteristic variations thereof have been reduced, which is effective in stabilizing characteristics of the thermoelectric conversion module.

Next, the manufacturing method of a thermoelectric conversion material according to an embodiment will be described. The manufacturing method of a thermoelectric conversion material according to an embodiment is not particularly limited, but the next manufacturing method can be cited as an efficient method.

A first manufacturing method of a thermoelectric conversion material according to an embodiment includes a step of preparing a raw material molten metal satisfying the composition formula (1), a step of preparing a raw material powder by cooling the raw material molten metal at a cooling rate of 100° C./s or slower, a step of molding the obtained raw material powder, and a step of sintering the obtained molded body.

First, the step of preparing a raw material molten metal satisfying the composition formula (1) is performed. In the step of preparing the raw material molten metal, the raw material molten metal is prepared by mixing and melting the A element, Ti, the D element, and the X element so as to agree with the intended composition formula (1). When producing a molten metal of raw material powder, the melting method of arc melting, high-frequency melting or the like is preferable. The crucible used for melting is preferably made of alumina, magnesia, or calcia. When melting raw materials in a crucible, components constituting the crucible may be mixed as impurities. Even if impurities Al are mixed as described above, such impurities react with the D element such as Ni or Co so that the influence of impurity mixing can be reduced.

The step of preparing a raw material powder by cooling the raw material molten metal at a cooling rate of 100° C./s or slower is performed. The raw material molten metal is normally at a high temperature of 1500° C. or higher. When poured into a mold from the crucible, the raw material molten metal is normally cooled rapidly at 500° C./s or more. In the first manufacturing method, the cooling step needs to be performed such that the raw material molten metal is cooled relatively slowly at 100° C./s or less. If the cooling rate is slowed to 100° C./s or less, a difference in cooling of the raw material molten metal arises in the mold, which makes it easier to form MgAgAs type crystal grains having regions of different Ti concentrations. A method of pre-heating the mold can be cited as a method of slowing the cooling rate to 100° C./s or less.

The step of preparing a raw material powder preferably includes a step of pulverizing an ingot produced in the cooling step. The raw material molten metal poured into the mold as described above becomes an ingot after being cooled. As the pulverization step, a jet mill, a hammer mill, and a pin mill can be cited. When pulverized to the average grain size of, for example, 10 μm or less, the jet mill may be used and when pulverized to the average grain size exceeding 10 μm, the hammer mill or the pin mill may be used. In addition, these pulverization methods may be combined. It is preferable to perform the pulverization step in an inert atmosphere. In addition, it is preferable that the average grain size of raw material powder be 1 μm or more and 60 μm or less. By preparing a raw material powder, moldability and the degree of sintering can be improved.

Next, the step of molding the obtained raw material powder is performed. As the molding step, die molding and sheet molding can be cited. Also in the molding step, an organic binder such as PVA is to be used if necessary.

The molded body may be made larger than the actual thermoelectric conversion material in size or a near net shape molded body close to the actual thermoelectric conversion material size.

Next, the step of sintering the obtained molded body is performed. As the sintering method, pressureless sintering, pressure sintering in a controlled atmosphere, the hot press method, the SPS (spark plasma sintering) method, and the HIP (hot isostatic pressing) method can be cited. In the hot press method, the same mold may be used for molding and sintering. From the viewpoint of inhibiting oxidation of a sintered body, the sintering step is preferably performed in an inert atmosphere of, for example, Ar.

The sintering temperature is preferably 950° C. or higher and 1600° C. or lower, the sintering time is 0.5 h or longer and 50 h or shorter, and the sintering pressure is standard pressure or higher and 200 MPa or lower.

It is also preferable to sinter such that the density of the obtained sintered body has a relative density of 98% or more. The density of a sintered body can be determined by (measured value by the method of Archimedes/theoretical density)×100%.

When a thermoelectric conversion material (thermoelectric device) is cut from a sintered body by cutting, a cutting margin increases, decreasing the usage efficiency of the material. Thus, it is preferable to apply a near net shape process to mold to dimensions close to a device shape for sintering. If the sintering density by pressureless sintering is slightly insufficient, the density can be increased by a HIP process.

The shape of the sintered body can be any of various shapes, such as a cylindrical shape and a rectangular parallelopiped shape. The surface of a sintered body may be polished if necessary. Multiple molding that cuts out a plurality of thermoelectric conversion materials by cutting a sintered body may also be performed.

As dimensions of the thermoelectric conversion material when mounted on a thermoelectric module, for example, a cylindrical shape with an outside diameter of 0.5 to 10 mm and thickness of 1 to 30 mm and a rectangular parallelopiped shape measuring 0.5 to 10 mm per side and thickness of 1 to 30 mm can be cited.

To increase the dimensional accuracy of manufactured products thereafter, tolerances can be reduced by a method of mechanical polishing or the like. Further, the surface of the processed sample can be applied with a surface treatment using Ni, Ni/Au, Ti/Ni/Au or the like to create a highly heat resistant insulating coating on four surfaces thereof and plating or vapor deposition on two surfaces thereof. The total thickness thereof may be 1 to 20 μm. This has an effect of enabling higher reliability of a junction due to wettability improvement during brazing filler metal joining and further, as a barrier layer that prevents diffusion of materials.

Next, a second manufacturing method will be described. The second manufacturing method includes a step of preparing a raw material molten metal satisfying the composition formula (1), a step of preparing a raw material powder by rapidly cooling the raw material molten metal at a cooling rate exceeding 100° C./s, a step of heat-treating the obtained raw material powder, and a step of sintering the obtained molded body.

The step of preparing a raw material molten metal is the same as in the first manufacturing method and so is not described here. In the second manufacturing method, the step of preparing a raw material powder by rapidly cooling the raw material molten metal at a cooling rate exceeding 100° C./s is performed. Then, the step of heat-treating the obtained raw material powder is performed.

As the step of rapidly cooling at a cooling rate exceeding 100° C./s, the simple-roll process, the twin-roll process, the rotating disk method, and the gas atomizing method can be cited. The grain size of the obtained raw material powder can be controlled by adjusting the input amount of molten metal, the rotating speed of the roll or disk, and the amount of injected gas, the last of which is most preferable. In addition, the gas atomizing method can prevent impurity mixing during pulverization.

If the raw material powder is prepared by the step of rapidly cooling at a cooling rate exceeding 100° C./s, in contrast to the first manufacturing method, MgAgAs type crystal grains having regions of different Ti concentrations are hardly formed in the powder stage. Thus, it is preferable to heat-treat the raw material powder. The raw material powder is preferably heat-treated under heat treatment conditions of 800 to 1500° C. for 1 to 1000 h in an inert atmosphere. Even if the raw material powder is prepared by the cooling rate exceeding 100° C./s, MgAgAs type crystal grains having regions of different Ti concentrations can be formed by heat-treating the raw material powder.

The subsequent molding step and sintering step are the same as in the first manufacturing method.

Next, a third manufacturing method will be described. The third manufacturing method of a thermoelectric conversion material according to an embodiment includes a step of preparing a raw material molten metal satisfying the composition formula (1), a step of preparing a raw material powder by rapidly cooling the raw material molten metal at a cooling rate exceeding 100° C./s, a step of molding the obtained raw material powder, a step of sintering the obtained molded body, and a step of heat-treating the obtained sintered body.

The step of preparing a raw material molten metal is the same as in the first manufacturing method. Also, the step of preparing a raw material powder by rapidly cooling the raw material molten metal at a cooling rate exceeding 100° C./s is the same as in the second manufacturing method. Also, the molding step and the sintering step are the same as in the first manufacturing method.

The third manufacturing method is characterized in that after a sintered body is obtained, the sintered body is heat-treated. The sintered body is preferably heat-treated at 800 to 1600° C. for 1 to 1000 h in an inert atmosphere. Even if the sintered body is heat-treated, MgAgAs type crystal grains having regions of different Ti concentrations can be formed. The heat treatment may also be performed after a large sintered body is cut out as a thermoelectric conversion material in the final shape. Because heat is uniformly distributed throughout the sintered body, it is better to give the heat treatment after the thermoelectric conversion material (thermoelectric devices) in the final shape is formed so that MgAgAs type crystal grains having regions of different Ti concentrations can be formed. From this point, the method of forming the sintered body in a shape close to the final shape of the thermoelectric conversion material (thermoelectric device) by performing near net shaping is also effective.

The first, second, and third manufacturing methods described above are suitable for manufacturing a thermal conversion material for which a frequency graph of the Ti concentration has two or more peaks.

According to the first manufacturing method, the second manufacturing method, and the third manufacturing method described above, a thermoelectric conversion material according to an embodiment can be manufactured with high yields. Also, according to the first manufacturing method, the second manufacturing method, and the third manufacturing method, the method of mixing and using two types of raw material powder or more satisfying the composition formula (1) is also effective. Particularly, by using two types of raw material powder or more having different Ti amounts, it becomes easier to cause a difference in Ti concentrations.

A fourth manufacturing method is a method suitable for manufacturing a thermoelectric conversion material for which a frequency graph of the Ti concentration has one peak and the lower limit is smaller than the frequency indicating a peak by 5 or more and the upper limit is larger than the frequency indicating a peak by 5 or more.

In the fourth manufacturing method, first a step of preparing a raw material molten metal satisfying the composition formula (1) is performed. In the step of preparing a raw material molten metal, the raw material molten metal is prepared by mixing and melting the A element, Ti, the D element, and the X element so as to agree with the intended composition formula (1). When producing a molten metal of raw material powder, the melting method of arc melting, high-frequency melting and the like is preferable. The crucible used for melting is preferably made of alumina, magnesia, or calcia. When melting raw materials in a crucible, components constituting the crucible may be mixed as impurities. Even if impurities Al are mixed as described above, such impurities react with the D element such as Ni or Co so that the influence of impurity mixing can be reduced.

Next, a raw material powder is prepared by cooling the raw material molten metal. In this case, the cooling rate may exceed 100° C./s. More specifically, normal furnace cooling (500° C./s) can be cited as the cooling rate. In the cooling step, the raw material molten metal is poured into a mold to prepare a raw material ingot. The obtained raw material ingot is pulverized to obtain a raw material powder. As the pulverization step, a jet mill, a hammer mill, and a pin mill can be cited. When pulverized to the average grain size of, for example, 10 μm or less, the jet mill may be used and when pulverized to the average grain size exceeding 10 μm, the hammer mill or the pin mill may be used. In addition, these pulverization methods may be combined. It is preferable to perform the pulverization step in an inert atmosphere. In addition, it is preferable that the average grain size of raw material powder be 1 μm or more and 60 μm or less. By preparing the raw material powder, moldability and the degree of sintering can be improved.

Next, a step of molding the obtained raw material powder is performed. As the molding step, die molding and sheet molding can be cited. Also in the molding step, an organic binder such as PVA is to be used if necessary.

The molded body may be made larger than the actual thermoelectric conversion material in size or a near net shape molded body close to the actual thermoelectric conversion material.

Next, a step of sintering the obtained molded body is performed. As the sintering method, pressureless sintering, pressure sintering in a controlled atmosphere, the hot press method, the SPS (spark plasma sintering) method, and the HIP (hot isostatic pressing) method can be cited. In the hot press method, the same mold may be used for molding and sintering. From the viewpoint of inhibiting oxidation of a sintered body, the sintering step is preferably performed in an inert atmosphere such as, for example, Ar.

The sintering temperature is preferably 950° C. or higher and 1600° C. or lower, the sintering time is 0.5 h or longer and 50 h or shorter, and the sintering pressure is the normal pressure or higher and 200 MPa or lower. It is also preferable to set the cooling rate after the sintering step to 100° C./s or slower. By cooling slowly by setting the cooling rate after the sintering step to 100° C./s or slower, the uniform Ti concentration in MgAgAs type crystal grains changes due to heat of the sintering step before being stabilized in a changed state. By performing this step, the frequency graph of Ti can be made a broad graph in width, though there is only one peak. The cooling step is to be performed for each sintering step. If, for example, pressureless sintering and HIP sintering are combined, the cooling rate after the pressureless sintering is to be set to 100° C./s or slower and the cooling rate after the HIP sintering is to be set to 100° C./s or slower.

Regardless of the manufacturing method, it is preferable to sinter such that the density of the obtained sintered body has the relative density of 98% or more. The density of a sintered body can be determined by (measured value by the method of Archimedes/theoretical density)×100%.

When a thermoelectric conversion material (thermoelectric device) is cut from a sintered body by cutting, a cutting margin increases, decreasing the usage efficiency of the material. Thus, it is preferable to apply a near net shape process to mold to dimensions close to a device shape for sintering. If the sintering density by pressureless sintering is slightly insufficient, the density can be increased by a HIP process.

EXAMPLES

Examples 1 and 2

A raw material molten metal is prepared by high-frequency heating using an alumina crucible. Next, the raw material molten metal is poured into a pre-heated mold and cooled at a cooling rate of 100° C./s or slower to prepare an ingot. In Example 1 and Example 2, the cooling rate is set to 20° C./s. The obtained ingot is pulverized by the hammer mill method to obtain a raw material powder whose average grain size is 20 μm. Then, a large sintered body is produced by HIP sintering (1230° C.×4 h×100 MPa). Next, 100 thermoelectric conversion materials of 2 mm (length)×2 mm (width)×4 mm (height) are cut out from the large sintered body. The composition of the thermoelectric conversion materials is as shown in Table 1. The relative density of the sintered body in both cases is 99% or more. In addition, the content of metallic impurities in both cases is in the range of 500 to 1000 wtppm.

TABLE 1

| | Composition formula | P/N |
|---|---|---|
| Example 1 | $(Ti_{0.4}Zr_{0.4}Hf_{0.2})Co(Sn_{0.125}Sb_{0.875})$ | P-TYPE |
| Example 2 | $(Ti_{0.4}Zr_{0.4}Hf_{0.2})Ni(Sn_{0.99}Sb_{0.01})$ | N-TYPE |

Examples 3 and 4

After a raw material molten metal is prepared by high-frequency heating using an alumina crucible, a raw material powder is produced at the cooling rate exceeding 100° C./s by using the gas atomizing method. The cooling rate in Example 3 and Example 4 is set to 1000° C./s. The obtained raw material powder has the average grain size of 30 μm. The raw material powder is heat-treated at 1200° C. for 30 h in an Ar atmosphere.

Next, 1 wt % of PVA is mixed to prepare a molded body by the near net shape method using a mold. The molded body is sintered under conditions of 1550° C. for 20 h in an Ar atmosphere. Then, HIP sintering (1200° C.×2 h×120 MPa) is performed to produce 100 pieces of thermoelectric conversion material of 2 mm (length)×2 mm (width)×4 mm (height). The composition of the thermoelectric conversion materials is as shown in Table 2. The relative density of the sintered body in both cases is 99% or more. In addition, the content of metallic impurities in both cases is in the range of 200 to 700 wtppm.

TABLE 2

| | Composition formula | P/N |
|---|---|---|
| Example 3 | $(Ti_{0.3}Zr_{0.5}Hf_{0.2})Co(Sn_{0.15}Sb_{0.85})$ | P-TYPE |
| Example 4 | $(Ti_{0.5}Zr_{0.4}Hf_{0.1})Ni(Sn_{0.995}Sb_{0.005})$ | N-TYPE |

Examples 5 and 6

After a raw material molten metal is prepared by high-frequency heating using a magnesia crucible, a raw material powder is produced at the cooling rate exceeding 100° C./s by using the gas atomizing method. The cooling rate in Example 5 and Example 6 is set to 500° C./s. The obtained raw material powder has the average grain size of 35 μm.

Then, a large sintered body is produced by HIP sintering (1150° C.×5 h×150 MPa). Next, 100 pieces of thermoelectric conversion material of 2 mm (length)×2 mm (width)×4 mm (height) are cut out from the large sintered body. Next, the pieces of thermoelectric conversion material are heat-treated at 1200° C. for 100 h in an Ar atmosphere. The composition of the thermoelectric conversion materials is as shown in Table 3. The relative density of the sintered body in both cases is 99% or more. In addition, the content of metallic impurities in both cases is in the range of 200 to 700 wtppm.

TABLE 3

| | Composition formula | P/N |
|---|---|---|
| Example 5 | $(Ti_{0.3}Zr_{0.5}Hf_{0.2})Co(Sn_{0.15}Sb_{0.85})$ | P-TYPE |
| Example 6 | $(Ti_{0.5}Zr_{0.4}Hf_{0.1})Ni(Sn_{0.995}Sb_{0.005})$ | N-TYPE |

Examples 7 and 8

A raw material molten metal is prepared by high-frequency heating using an alumina crucible. Next, the raw material molten metal is poured into a pre-heated mold and cooled at a cooling rate of 100° C./s or slower to prepare an ingot of the composition shown in Table 4. The cooling rate in Example 7 is set to 100° C./s and the cooling rate in Example 8 is set to 80° C./s. The obtained ingot is pulverized by the hammer mill method to obtain a raw material powder whose average grain size is 20 μm. In Example 7, a raw material 1 and a raw material 2 are mixed in a weight ratio 1:1 using a ball mill to produce a powder for a sintered body. In Example 8, a raw material 3 and a raw material 4 are mixed in a weight ratio 1:1 using a ball mill to produce a powder for a sintered body.

Then, a large sintered body is produced by HIP sintering (1230° C.×4 h×100 MPa). Next, 100 pieces of thermoelectric conversion material of 2 mm (length)×2 mm (width)×4 mm (height) are cut out from the large sintered body. The composition of the thermoelectric conversion materials is as shown in Table 4. The relative density of the sintered body in both cases is 99% or more. In addition, the content of metallic impurities in both cases is in the range of 500 to 1300 wtppm.

TABLE 4

|  | Raw material powder | Composition formula | P/N |
|---|---|---|---|
| Example 7 | Raw material 1 | $(Ti_{0.2}Zr_{0.6}Hf_{0.2})Co(Sn_{0.15}Sb_{0.85})$ | P-TYPE |
|  | Raw material 2 | $(Ti_{0.6}Zr_{0.2}Hf_{0.2})Co(Sn_{0.15}Sb_{0.85})$ |  |
|  | Sintered body | $(Ti_{0.4}Zr_{0.2}Hf_{0.2})Co(Sn_{0.15}Sb_{0.85})$ |  |
| Example 8 | Raw material 3 | $(Ti_{0.7}Zr_{0.2}Hf_{0.1})Ni(Sn_{0.995}Sb_{0.005})$ | N-TYPE |
|  | Raw material 4 | $(Ti_{0.2}Zr_{0.7}Hf_{0.1})Ni(Sn_{0.995}Sb_{0.005})$ |  |
|  | Sintered body | $(Ti_{0.5}Zr_{0.7}Hf_{0.1})Ni(Sn_{0.995}Sb_{0.005})$ |  |

Examples 9 and 10

A raw material molten metal is prepared by high-frequency heating using an alumina crucible. Next, the raw material molten metal is poured into a pre-heated mold and cooled at a cooling rate of 100° C./s or slower to prepare an ingot. The cooling rate in Example 9 is set to 20° C./s and the cooling rate in Example 10 is set to 5° C./s. Then, the ingot is heat-treated at 1200° C. for 10 h in an Ar atmosphere. The obtained ingot is pulverized by the hammer mill method to obtain a raw material powder whose average grain size is 25 µm in Example 9 and raw material powder whose average grain size is 42 µm in Example 10. Then, a large sintered body is produced by HIP sintering (1200° C.×10 h×100 MPa). Next, 100 pieces of thermoelectric conversion material of 2 mm (length)×2 mm (width)×4 mm (height) are cut out from the large sintered body. The composition of the thermoelectric conversion materials is as shown in Table 5. The relative density of the sintered body in both cases is 99% or more. In addition, the content of metallic impurities in both cases is in the range of 700 to 1500 wtppm.

TABLE 5

|  | Composition formula | P/N |
|---|---|---|
| Example 9 | $(Ti_{0.4}Zr_{0.5}Hf_{0.1})Co(Sn_{0.125}Sb_{0.875})$ | P-TYPE |
| Example 10 | $(Ti_{0.4}Zr_{0.5}Hf_{0.1})Ni(Sn_{0.99}Sb_{0.01})$ | N-TYPE |

Comparative Examples 1 and 2

A raw material molten metal is prepared by using an alumina crucible. Next, the raw material molten metal is poured into a mold that is not pre-heated and rapidly cooled at a cooling rate of 500° C./s or faster to prepare an ingot. The cooling rate is set to 600° C./s in Comparative Example 1 and Comparative Example 2. The obtained ingot is pulverized by using the hammer mill to obtain a raw material powder whose average grain size is 20 µm. Then, a large sintered body is produced by HIP sintering (1250° C.×3.5 h×100 MPa). Next, 100 pieces of thermoelectric conversion material of 2 mm (length)×2 mm (width)×4 mm (height) are cut out from the large sintered body. The composition of the thermoelectric conversion materials is as shown in Table 6. The content of metallic impurities in both cases is in the range of 800 to 1700 wtppm.

TABLE 6

|  | Composition formula | P/N |
|---|---|---|
| Comparative Example 1 | $(Ti_{0.4}Zr_{0.4}Hf_{0.2})Co(Sn_{0.125}Sb_{0.875})$ | P-TYPE |
| Comparative Example 2 | $(Ti_{0.4}Zr_{0.4}Hf_{0.2})Ni(Sn_{0.99}Sb_{0.01})$ | N-TYPE |

Comparative Examples 3 and 4

After raw material molten metal is prepared by high-frequency heating using an alumina crucible, a raw material powder concerning raw materials 5 to 8 shown in Table 7 is obtained by using the gas atomizing method. The raw material 5 is set to the average grain size 34 µm, the raw material 6 is set to the average grain size 37 µm, the raw material 7 is set to the average grain size 38 µm, and the raw material 8 is set to the average grain size 40 µm. The cooling rate in Comparative Example 3 and Comparative Example 4 is set to 1000° C./s.

Next, the raw material 5 and the raw material 6 are weighed such that the weight ratio becomes equal to the composition of a sintered body and mixed by using a ball mill. The mixed powder is hot-pressed at 1200° C. and 40 MPa for 3 h in an Ar atmosphere. The cooling rate after the hot press is set to the furnace cooling (600° C./s). A P-type thermoelectric conversion material according to Comparative Example 3 is prepared by this work.

Also, the raw material 7 and the raw material 8 are weighed such that the weight ratio becomes equal to the composition of a sintered body and mixed by using a ball mill. The mixed powder is hot-pressed at 1300° C. and 40 MPa for 1 h in an Ar atmosphere. The cooling rate after the hot press is set to the furnace cooling (600° C./s). An N-type thermoelectric conversion material according to Comparative Example 4 is prepared by this work.

Incidentally, Comparative Example 3 corresponds to Example 6 in Patent Literature 2 (Jpn. Pat. Appln. KOKAI Publication No, 2010-129636A) and Comparative Example 4 corresponds to Example 1. The content of metallic impurities in both cases is in the range of 500 to 1800 wtppm.

TABLE 7

|  | Raw material powder | Composition formula | P/N |
|---|---|---|---|
| Comparative Example 3 | Raw material 5 | $(Zr_{0.5}Hf_{0.5})Co(Sn_{0.15}Sb_{0.85})$ | P-TYPE |
|  | Raw material 6 | $TiCo(Sn_{0.15}Sb_{0.85})$ |  |
|  | Sintered body | $(Ti_{0.3}(Zr_{0.5}Hf_{0.5})_{0.7})Co(Sn_{0.15}Sb_{0.85})$ |  |
| Comparative Example 4 | Raw material 7 | $(Zr_{0.5}Hf_{0.5})Ni(Sn_{0.994}Sb_{0.006})$ | N-TYPE |
|  | Raw material 8 | $TiNi(Sn_{0.994}Sb_{0.006})$ |  |
|  | Sintered body | $(Ti_{0.5}(Zr_{0.5}Hf_{0.5})_{0.5})Ni(Sn_{0.994}Sb_{0.006})$ |  |

EBSD analysis of any cross section of thermoelectric conversion materials according to Examples 1 to 10 and Comparative Examples 1 to 4 is carried out. The crystal orientation and the frequency graph of characteristic X-rays of Ti are determined by the EBSD analysis. For the EBSD analysis, JSM-6500F (manufactured by JEOL Ltd.) is used as the thermal field emission scanning electron microscope (TFE-SEM) and Genesis-S-UTW (manufactured by EDAX) is used for the energy-dispersive X-ray spectroscopy (EDS). Analysis conditions include an acceleration voltage of 20.0 kV, irradiation current of 8.7 nA, and sample inclination of 70 deg. Each sample is prepared by polishing the surface of a sintered body to a flat surface with a surface roughness Ra of 1 μm or less.

A frequency graph of characteristic X-rays of Ti is created by measuring characteristic X-rays of Ti at intervals of 0.2 μm in a MgAgAs type crystal grain and plotting the strength ratio of characteristic X-rays of Ti on the horizontal axis and the frequency for each strength of characteristic X-rays of Ti on the vertical axis. This work is performed for the measuring area of 240 μm×80 μm to determine the number ratio of MgAgAs type crystal grains for which two or more peaks are present. Similarly, the area of 240 μm×80 μm is used to determine the average crystal grain size and the area ratio of MgAgAs type crystal grains.

Figure 5:
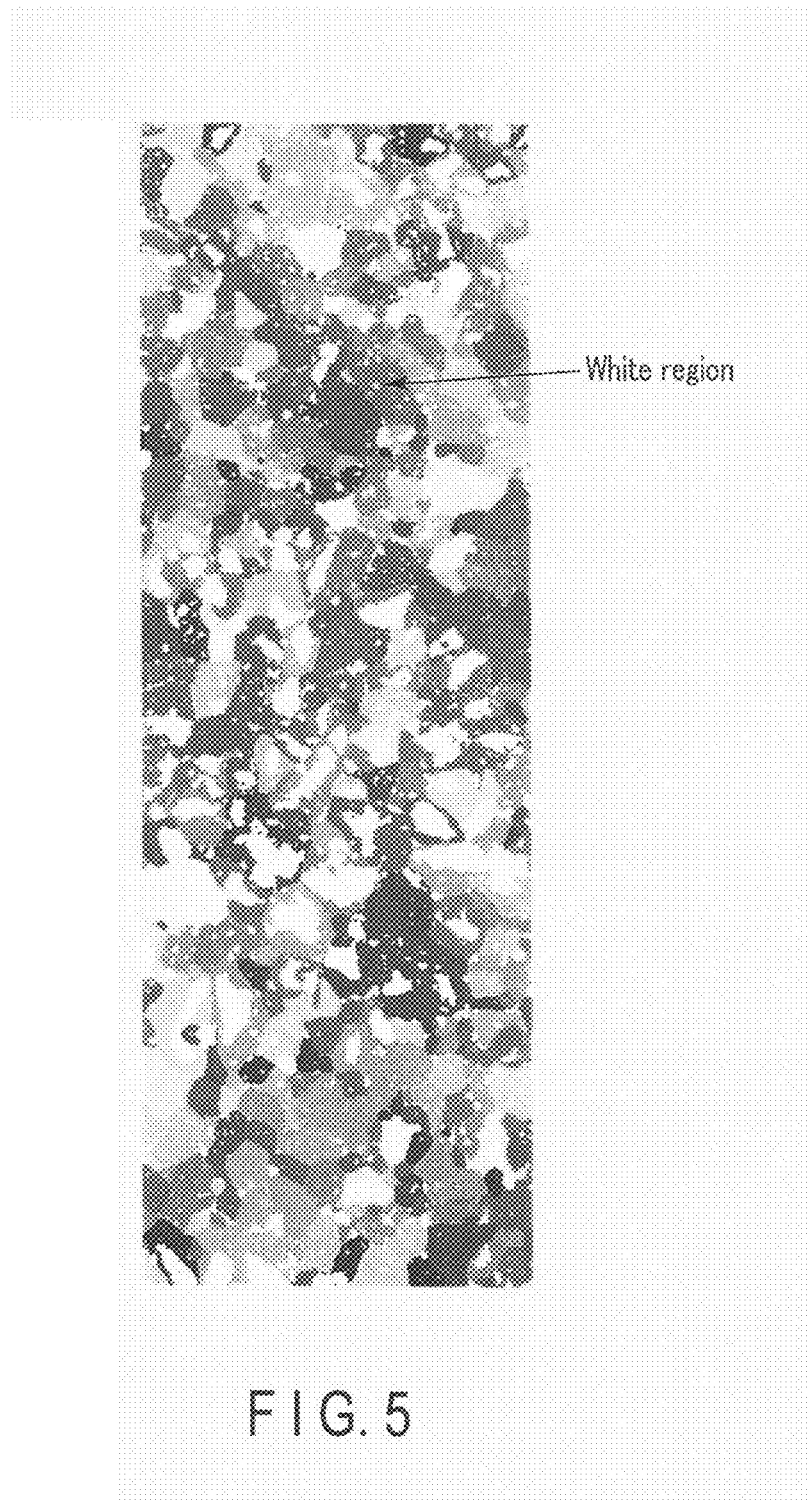
FIG. 5 is a color photograph showing an example of a crystal orientation map by EBSD in Example 1.

The results are shown in Table 8.

colors represent orientation in respective intermediate directions. A white portion viewed inside one crystal grain is a portion where, if the strength of Ti is set to 15 or more, the strength is 15 or less. That is, white regions present in a MgAgAs type crystal grain are regions of different strength ratios of Ti. In FIG. 5, white regions are present in almost all MgAgAs type crystal grains. On the other hand, as shown in the color photograph of FIG. 6, each MgAgAs type crystal grain is distinguished by various colors such as red, pink, blue, light blue, and green. Though crystal grains that look white as a whole are present in FIG. 6, no white region is present in MgAgAs type crystal grains. Thus, there is no region of different Ti concentrations in MgAgAs type crystal grains according to Comparative Example 3.

Measurement of a frequency graph of Sn concentration in Example 7 shows a behavior similar to that of the Ti concentration graph in FIG. 4. That is, the Sn concentration is also high in places where the Ti concentration is high. Conversely, the Sn concentration is also low in places where the Ti concentration is low. Such a tendency is similarly observed in other Examples.

Next, the ZT value of thermoelectric conversion materials of each Example and Each Comparative Example are measured. For the measurement of the ZT value, the electric resistance and the Seebeck coefficient are measured by ZEM-3 manufactured by ULVAC-RIKO Inc. and also the

TABLE 8

| | Frequency graph | | | Number ratio (%) per unit area of 240 μm × 80 μm | Average crystal grain size (μm) | Area ratio (%) of MgAgAs type crystal grains |
|---|---|---|---|---|---|---|
| | Number of peaks | K1/K2 | Difference between maximum value and minimum value | | | |
| Example 1 | 2 | 1.47 | 14.3 | 90 | 18.9 | 97 |
| Example 2 | 2 | 1.47 | 20.0 | 95 | 16.8 | 95 |
| Example 3 | 2 | 1.37 | 15.2 | 85 | 6.8 | 99 |
| Example 4 | 2 | 1.37 | 14.5 | 80 | 7.8 | 98 |
| Example 5 | 2 | 1.28 | 21.2 | 70 | 9.4 | 98 |
| Example 6 | 2 | 1.28 | 18.6 | 65 | 8.6 | 98 |
| Example 7 | 4 | 3.78 | 23.5 | 90 | 21.4 | 98 |
| Example 8 | 4 | 3.66 | 28.2 | 90 | 20.8 | 98 |
| Example 9 | 2 | 1.28 | 14.0 | 90 | 35.2 | 97 |
| Example 10 | 2 | 1.30 | 12.4 | 90 | 58.2 | 96 |
| Comparative Example 1 | 1 | — | <3 | — | 7.5 | 92 |
| Comparative Example 2 | 1 | — | <3 | — | 8.2 | 92 |
| Comparative Example 3 | 1 | — | <3 | — | 44.5 | 98 |
| Comparative Example 4 | 1 | — | <3 | — | 45.1 | 98 |

In all Examples and Comparative Examples, the crystal orientation is randomly oriented because the number ratio is less than 0.5 for all of the (001) plane, the (101) plane, and the (111) plane. As a result of color-mapping regions where the strength ratio of characteristic X-rays of Ti is 15 or more and regions where the strength ratio is less than 15 for the unit area of 240 μm×80 μm, the number ratio of MgAgAs type crystal grains for which two or more peaks are present in the frequency graph matches the results of Table 8.

Figure 6:
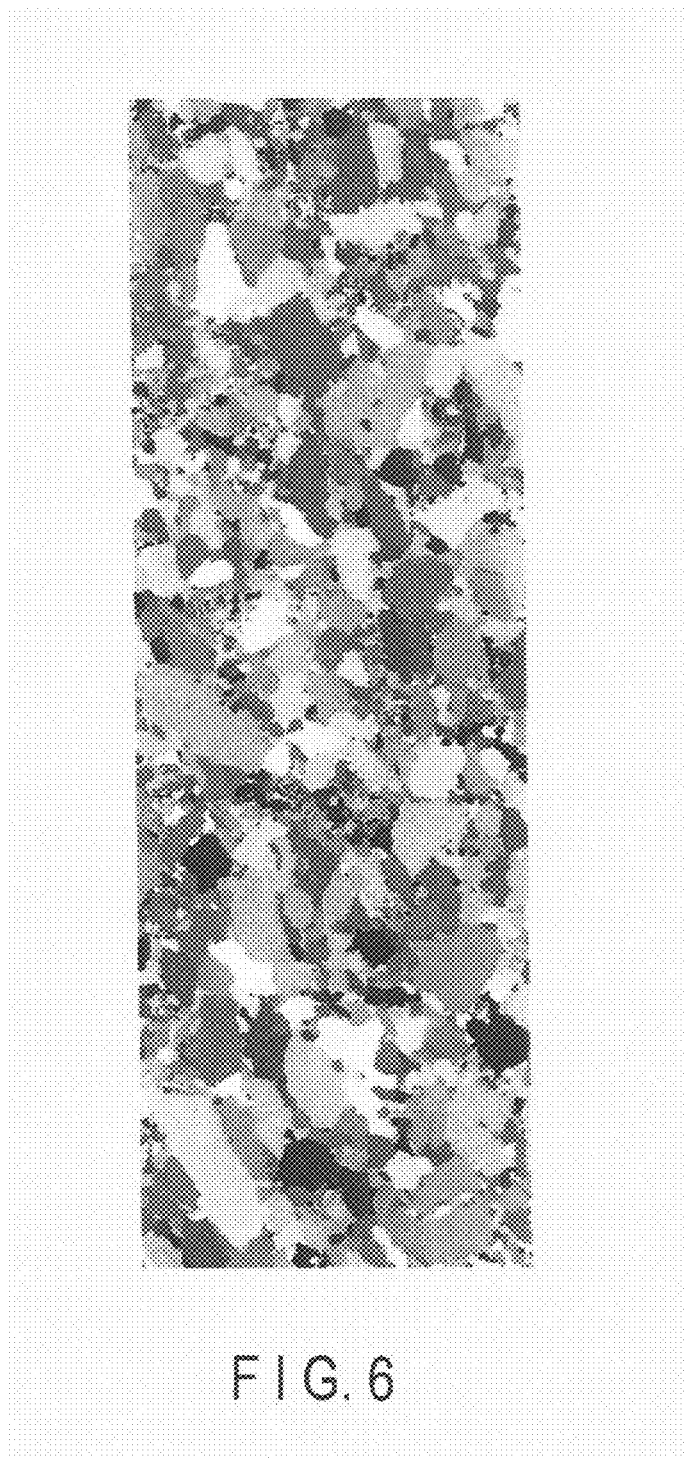
FIG. 6 is a color photograph showing an example of the crystal orientation map by EBSD in Comparative Example 3.

A frequency graph in Example 7 is shown in FIG. 4. A crystal orientation map (color mapping) by EBSD in Example 1 is shown in FIG. 5 and a crystal orientation map (color mapping) by EBSD in Comparative Example 3 is shown in FIG. 6. FIGS. 5 and 6 are results of color-mapping regions where the strength ratio of characteristic X-rays of Ti is 15 or more and regions where the strength ratio is less than 15. In the color photograph shown in FIG. 5, red, blue, and green mean that respective crystal grains are oriented in the (001), (111), and (101) directions and intermediate thermal diffusivity is measured by the laser flash method in an Ar atmosphere, the specific heat is measured by the DSC method, and the density is measured by the method of Archimedes to calculate the thermal conductivity. In addition, 100 pieces of thermoelectric conversion material produced for each Example and Comparative Example are measured to show the average value, the maximum value, and the minimum value. The results are shown in Table 9.

TABLE 9

| | ZT value | | |
|---|---|---|---|
| | Average value | Maximum value | Minimum value |
| Example 1 | 0.9 | 1.1 | 0.85 |
| Example 2 | 1.1 | 1.2 | 1.0 |
| Example 3 | 0.8 | 0.9 | 0.76 |
| Example 4 | 1.0 | 1.1 | 0.95 |
| Example 5 | 0.9 | 0.95 | 0.85 |

TABLE 9-continued

| | ZT value | | |
|---|---|---|---|
| | Average value | Maximum value | Minimum value |
| Example 6 | 1.0 | 1.05 | 0.93 |
| Example 7 | 1.1 | 1.15 | 1.0 |
| Example 8 | 1.2 | 1.3 | 1.1 |
| Example 9 | 1.0 | 1.1 | 0.95 |
| Example 10 | 0.9 | 0.95 | 0.86 |
| Comparative Example 1 | 0.8 | 1.05 | 0.65 |
| Comparative Example 2 | 1.0 | 1.2 | 0.75 |
| Comparative Example 3 | 0.8 | 1.0 | 0.67 |
| Comparative Example 4 | 0.9 | 1.1 | 0.60 |

As is evident from Table 9, thermoelectric conversion materials according to Examples have high average values of the ZT value and variations thereof are small. That is, it turns out that an effect of stabilizing characteristics is achieved. Therefore, characteristics of a thermoelectric conversion module using a thermoelectric conversion material according to an embodiment are stable. This is particularly effective for a large thermoelectric conversion module of 50 sets or more, with each set including a P-type and N-type pair.

Examples 11 to 14

A raw material molten metal is prepared by high-frequency heating using an alumina crucible. Next, the raw material molten metal is poured into a water-cooled mold and cooled at a cooling rate of 500° C./s or faster to prepare an ingot. The cooling rate is set to 500° C./s in Examples 11 and 12 and the cooling rate is set to 600° C./s in Examples 13 and 14.

Incidentally, alloys in Examples 11 and 12 are heat-treated at 800° C. for 20 h in an Ar atmosphere. The obtained ingot is pulverized by the hammer mill method to obtain a raw material powder whose average grain size is 40 μm in Examples 11 to 14.

Next, 5 wt % of PVA is mixed to prepare a molded body by the near net shape method using a mold. The molded body is sintered under conditions of 1300° C. for 3 h in an Ar atmosphere. The cooling rate after sintering is set to 40° C./s in Examples 11 and 12 and the cooling rate is set to 70° C./s in Examples 13 and 14.

Then, HIP sintering (1230° C.×3 h×120 MPa) is performed to produce 100 pieces of thermoelectric conversion material of 2 mm (length)×2 mm (width)×4 mm (height). Also, the cooling rate after the HIP sintering is set to 10° C./s in Examples 11 and 12 and the cooling rate is set to 5° C./s in Examples 13 and 14.

The composition of the thermoelectric conversion materials is as shown in Table 10. The relative density of the sintered body in all cases is 99% or more. In addition, the content of metallic impurities in all cases is in the range of 500 to 1000 wtppm.

TABLE 10

| | Composition formula | P/N |
|---|---|---|
| Example 11 | $(Ti_{0.4}(Zr_{0.4}Hf_{0.2})Co(Sn_{0.125}Sb_{0.875})$ | P-TYPE |
| Example 12 | $(Ti_{0.4}(Zr_{0.4}Hf_{0.2})Ni(Sn_{0.99}Sb_{0.01})$ | N-TYPE |
| Example 13 | $(Ti_{0.3}(Zr_{0.5}Hf_{0.2})Co(Sn_{0.15}Sb_{0.85})$ | P-TYPE |
| Example 14 | $(Ti_{0.5}(Zr_{0.4}Hf_{0.1})Ni(Sn_{0.995}Sb_{0.005})$ | N-TYPE |

An analysis similar to that in Example 1 is carried out in Examples 11 to 14. The results are shown in Table 11. In addition, a frequency graph showing the relationship between the strength ratio of characteristic X-ray strength of Ti and the frequency for thermoelectric conversion materials in Example 11 is shown in FIG. 7.

TABLE 11

| | Frequency graph | | | | | | | |
|---|---|---|---|---|---|---|---|---|
| | Number of peaks | Frequency indicating a peak | Minimum value | Maximum value | Difference between maximum value and minimum value | Number ratio (%) per unit area of 240 μm × 80 μm | Average crystal grain size (μm) | Area ratio (%) of MgAgAs type crystal grains |
| Example 11 | 1 | 16.5 | 13.5 | 29.5 | 16.0 | 90 | 23.5 | 96 |
| Example 12 | 1 | 18.0 | 10.8 | 28.6 | 17.8 | 95 | 21.2 | 97 |
| Example 13 | 1 | 14.1 | 10.5 | 21.4 | 10.9 | 85 | 8.4 | 95 |
| Example 14 | 1 | 22.0 | 14.2 | 27.6 | 13.4 | 80 | 9.6 | 94 |
| Comparative Example 1 | 1 | 18.5 | 17.8 | 19.4 | <3 | — | 7.5 | 92 |
| Comparative Example 2 | 1 | 18.2 | 17.0 | 19.4 | <3 | — | 8.2 | 92 |
| Comparative Example 3 | 1 | 13.8 | 12.4 | 14.2 | <3 | — | 44.5 | 98 |
| Comparative Example 4 | 1 | 21.6 | 20.2 | 22.7 | <3 | — | 45.1 | 98 |

Next, the ZT value of thermoelectric conversion materials according to Examples 11 to 14 is measured in the same way as in Example 1. The results are shown in Table 12.

TABLE 12

| | ZT value | | |
|---|---|---|---|
| | Average value | Maximum value | Minimum value |
| Example 11 | 0.90 | 1.06 | 0.85 |
| Example 12 | 1.10 | 1.16 | 1.06 |
| Example 13 | 0.82 | 0.85 | 0.77 |
| Example 14 | 1.00 | 1.06 | 0.97 |
| Comparative Example 1 | 0.8 | 1.05 | 0.65 |
| Comparative Example 2 | 1.0 | 1.2 | 0.75 |
| Comparative Example 3 | 0.8 | 1.0 | 0.67 |
| Comparative Example 4 | 0.9 | 1.1 | 0.65 |

As is evident from Table 12, thermoelectric conversion materials according to Examples have high average values of the ZT value and variations thereof are small. Even if the number of peaks of a frequency graph is one, it turns out that characteristics are improved if the frequency graph is a broad graph in width, i.e., "maximum value−minimum value ≥10 (a value obtained by subtracting the minimum value from the maximum value is 10 or more)". Only one peak appears in the frequency graph in Example 11 shown in FIG. 7. It is assumed that the frequency indicating a peak is P, the lower limit (minimum value) of the frequency graph is V1, and the upper limit (maximum value) is V2. In Example 11, the frequency P indicating a peak is 16.5, the minimum value V1 is 13.5, and the maximum value V2 is 29.5. Thus, the minimum value V1 in Example 11 is smaller than the frequency P indicating a peak by "3" and the maximum value V2 is larger than the frequency P indicating a peak by "13", resulting in a difference of 16 between the maximum value V2 and the minimum value V1.

Therefore, characteristics of a thermoelectric conversion module using a thermoelectric conversion material according to an embodiment are stable. This is particularly effective for a large thermoelectric conversion module of 50 sets or more, with each set including a P-type and N-type pair.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A thermoelectric conversion material made of a polycrystalline material which is represented by a composition formula (1) shown below and has a MgAgAs type crystal structure, the polycrystalline material comprising: MgAgAs type crystal grains having regions of different Ti concentrations,

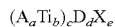  Composition formula (1)

wherein 0.2≤a≤0.7, 0.3≤b≤0.8, a+b=1, 0.93≤c≤1.08, 0.93≤e≤1.08, and d=1; A is at least one element selected from the group consisting of Zr and Hf, D is at least one element selected from the group consisting of Ni, Co, and Fe, and X is at least one element selected from the group consisting of Sn and Sb.

2. The thermoelectric conversion material according to claim 1, which comprises MgAgAs type crystal grains for which two or more peaks are present in a frequency graph in which a strength ratio of characteristic X-rays of Ti is plotted on a horizontal axis and a frequency for each strength of the characteristic X-rays of Ti is plotted on a vertical axis when the characteristic X-rays of Ti are measured at intervals of 0.2 μm in a MgAgAs type crystal grain on any cross section of the thermoelectric conversion material by EBSD (backscattering electron beam diffraction).

3. The thermoelectric conversion material according to claim 1, which comprises MgAgAs type crystal grains for which two or more peaks are present in a frequency graph in which a strength ratio of characteristic X-rays of Ti is plotted on a horizontal axis and a frequency for each strength of the characteristic X-rays of Ti is plotted on a vertical axis when the characteristic X-rays of Ti are measured at intervals of 0.2 μm in a MgAgAs type crystal grain on any cross section of the thermoelectric conversion material by EBSD (backscattering electron beam diffraction), and a ratio (K1/K2) of a frequency K1 of a highest peak to a frequency K2 of a lowest peak is 1.2 or greater.

4. The thermoelectric conversion material according to claim 1, which comprises MgAgAs type crystal grains for which two or more peaks are present in a frequency graph in which a strength ratio of characteristic X-rays of Ti is plotted on a horizontal axis and a frequency for each strength of the characteristic X-rays of Ti is plotted on a vertical axis when the characteristic X-rays of Ti are measured at intervals of 0.2 μm in a MgAgAs type crystal grain in a unit area of 240 μm×80 μm on any cross section of the thermoelectric conversion material by EBSD (backscattering electron beam diffraction), and the MgAgAs type crystal grains have a number ratio of crystal grains of 30% or more and 100% or less.

5. The thermoelectric conversion material according to claim 2, wherein a value obtained by subtracting a lower limit from an upper limit of the frequency graph is 10 or more.

6. The thermoelectric conversion material according to claim 1, wherein when characteristic X-rays of Ti are measured at intervals of 0.2 μm in the MgAgAs type crystal grain on any cross section of the thermoelectric conversion material by EBSD (backscattering electron beam diffraction) to create a frequency graph in which a strength ratio of the characteristic X-rays of Ti is plotted on a horizontal axis and a frequency for each strength of the characteristic X-rays of Ti is plotted on a vertical axis, the frequency graph has one peak and a lower limit of the frequency graph is smaller than a frequency indicating a peak by 5 or more and an upper limit of the frequency graph is larger than the frequency indicating the peak by 5 or more.

7. The thermoelectric conversion material according to claim 6, wherein a value obtained by subtracting the lower limit from the upper limit of the frequency graph is 15 or more.

8. The thermoelectric conversion material according to claim 1, wherein when an area of 240 μm×80 μm on any sintered surface of the thermoelectric conversion material is analyzed by EBSD (backscattering electron beam diffraction) and a total number of crystal grains per unit area is set to 1, a number ratio of crystal grains comprising any crystal orientation of a (001) plane, a (101) plane, and a (111) plane is less than 0.5.

9. The thermoelectric conversion material according to claim 1, wherein an average crystal grain size is 2 to 40 μm.

10. The thermoelectric conversion material according to claim 1, wherein the polycrystalline material is a sintered body.

11. The thermoelectric conversion material according to claim 1, wherein MgAgAs type crystal grains have an area ratio of 92% or more in an area of 240 μm×80 μm.

12. The thermoelectric conversion material according to claim 1, wherein the D is at least one element selected from the group consisting of Ni and Co.

13. A thermoelectric conversion module, which comprises the thermoelectric conversion material according to claim 1.

14. A manufacturing method of the thermoelectric conversion material according to claim 1, comprising: preparing a raw material molten metal satisfying the composition formula (1); preparing a raw material powder by cooling the raw material molten metal at a cooling rate of 100° C./s or slower; molding the obtained raw material powder; and sintering the obtained molded body.

15. The manufacturing method of the thermoelectric conversion material according to claim 14, wherein the preparing the raw material powder comprises producing an ingot by the cooling and pulverizing the ingot.

16. A manufacturing method of the thermoelectric conversion material according to claim 1, comprising: preparing the raw material molten metal satisfying the composition formula (1); preparing the raw material powder by rapidly cooling the raw material molten metal at the cooling rate exceeding 100° C./s; heat-treating the obtained raw material powder in order to form the MgAgAs type crystal grains having the regions of different Ti concentrations; molding the heat-treated raw material powder; and sintering the obtained molded body.

17. A manufacturing method of the thermoelectric conversion material according to claim 1, comprising: preparing the raw material molten metal satisfying the composition formula (1); preparing the raw material powder by rapidly cooling the raw material molten metal at the cooling rate exceeding 100° C./s; molding the obtained raw material powder; sintering the obtained molded body; and heat-treating the obtained sintered body in order to form the MgAgAs type crystal grains having the regions of different Ti concentrations.

18. The manufacturing method of the thermoelectric conversion material according to claim 16, wherein the preparing the raw material powder by rapidly cooling the raw material molten metal at the cooling rate exceeding 100° C./s is an atomizing method.

* * * * *